United States Patent [19]

Yang et al.

[11] Patent Number: 5,650,341

[45] Date of Patent: Jul. 22, 1997

[54] PROCESS FOR FABRICATING CMOS DEVICE

[75] Inventors: Ching-Nan Yang, Jung-He; Li-Chun Peng, Chu-Dung, both of Taiwan

[73] Assignee: Mosel Vitelic Inc., Hsin Chu, Taiwan

[21] Appl. No.: 720,881

[22] Filed: Oct. 3, 1996

[51] Int. Cl.$^6$ .................................................. H01L 21/265
[52] U.S. Cl. ................................ 437/34; 437/44; 437/45; 437/57; 437/58; 257/274; 257/336; 257/338; 257/344; 257/371; 257/408
[58] Field of Search ...................... 437/57, 34, 44, 437/45, 56, 58; 257/274, 338, 371, 336, 344, 408

[56] References Cited

U.S. PATENT DOCUMENTS

| | | | |
|---|---|---|---|
| 4,764,477 | 8/1988 | Chang et al. | 437/44 |
| 4,978,626 | 12/1990 | Poon et al. | 437/44 |
| 4,997,782 | 3/1991 | Bergonzoni | 437/44 |
| 5,006,477 | 4/1991 | Farb | 437/44 |
| 5,015,595 | 5/1991 | Wollesen | 437/44 |
| 5,024,959 | 6/1991 | Pfiester | 437/44 |
| 5,024,960 | 6/1991 | Haken | 437/44 |
| 5,141,890 | 8/1992 | Haken | 437/44 |
| 5,166,087 | 11/1992 | Kakimoto et al. | 437/44 |
| 5,439,834 | 8/1995 | Chen | 437/34 |
| 5,516,711 | 5/1996 | Wang | 437/44 |
| 5,521,106 | 5/1996 | Okabe | 437/57 |
| 5,547,885 | 8/1996 | Ogoh | 437/44 |
| 5,585,299 | 12/1996 | Hsu | 437/58 |

FOREIGN PATENT DOCUMENTS 406209080  7/1994  Japan .......................... 437/34

*Primary Examiner*—John Niebling
*Assistant Examiner*—Long Pham
*Attorney, Agent, or Firm*—Madson & Metcalf

[57] ABSTRACT

The present invention is a process used for fabricating a CMOS device, which includes (a) forming a first photoresist over the gate conducting layer, (b) define a first gate upon one of the p-type and the n-type MOS regions, (c) executing a first ion implantation in order to form a first lightly doped drain (LDD) on the one of the p-type and the n-type MOS regions, (d) forming a first gate sidewall on the first gate, (e) executing a second ion implantation in order to form a first source and a first drain on the one of the p-type and the n-type MOS regions, (f) forming a second photoresist over the gate conducting layer, (g) eliminating a portion of the second photoresist and another portion of the gate conducting layer in order to define a second gate upon the other one of the p-type and the n-type MOS regions, (h) performing a third ion implantation in order to form a second lightly doped drain (LDD) on the the other portion of the p-type and the n-type MOS regions, (i) selectively forming a specific oxide on the other one of the p-type and the n-type MOS regions, which is not masked by the second gate, (j) removing a portion of the specific oxide in order to form a second gate sidewall on the second gate, (k) executing a fourth ion implantation in order to form a second source and a second drain on the other one of the p-type and the n-type MOS regions, and (l) eliminating a remaining portion of the second photoresist. According to the present invention which can not only reduce the cost and time but also promote the performance of the fabricated CMOS device.

31 Claims, 3 Drawing Sheets

PROCESS FOR FABRICATING CMOS DEVICE

FIELD OF THE INVENTION

The present invention relates to a process for fabricating a semiconductor device, and more particularly to a manufacturing process for fabricating a CMOS (Complementary Metal-Oxide Semiconductor) device.

BACKGROUND OF THE INVENTION

The increasing of the semiconductor device's integration necessitates the shrinkage of the channel length of the MOS device. Accordingly a dropped threshold voltage Vt and a short channel effect which will adversely influence the control of the MOS device by the gate voltage Vg thus take place. In addition, since the channel near the drain has increased carriers, an electrical breakdown is therefore occurred. A hot electron effect caused by the electrical breakdown accordingly happens, and thus the normal function of the MOS device is strongly influenced by the abovementioned phenomena.

Basically, the lightly doped drain (LDD) is a preferred method adopted to solve the hot electron effects. In executing the LDD, the density of the doped dopant on the regions nearby the source and the drain is reduced in order to solve therefor the electrical breakdown effect caused by the multiplied carriers occurred at the channel near to the source and the drain.

However, as is well known, the disadvantage of the LDD is the complexity resulting from the needed processes, and thus if it is further to be employed by the complex process of fabricating the CMOS device, the sophistication encountered in the involved fabricating process is therefore aggravated.

The entire procedure for manufacturing a CMOS device includes from the beginning process of forming the gate to the final process of accomplishing the source and the drain according to the conventional method. A process for fabricating a CMOS device having twin tubs is exemplarily illustrated as follows:

The CMOS device having therein an active area, a field oxide and a silicon substrate. The active area further includes a gate oxide, and a gate conducting layer is overlapped upon the field oxide and the gate oxide. The active area is utilized to form at least a p-type and an n-type MOS regions. The conventional method used for manufacturing the CMOS device containing the processes for forming a gate, the source and the drain generally includes the following steps:

(a) employing a photolithography and an etching technique to remove a portion of the gate conducting layer in order to respectively define a first and a second gate areas on the p-type and the n-type MOS regions;

(b) utilizing a photolithography and an etching technique to form a first photoresist mask over one of the p-type and the n-type MOS regions and executing a first ion implantation in order to form a first lightly doped drain (LDD) upon the other one of the p-type and the n-type MOS regions;

(c) eliminating the first photoresist mask;

(d) using a photolithography and an etching technique for forming a second photoresist mask over the other one of the p-type and the n-type MOS regions and performing a second ion implantation in order to form a second lightly doped drain (LDD) upon one of the p-type and the n-type MOS regions;

(e) removing the second photoresist mask;

(f) utilizing a chemical vapor deposition (CVD) for forming a dielectric layer upon the p-type and the n-type MOS regions;

(g) employing an anisotropic dry etching for removing a portion of the dielectric layer in order to respectively form a first and a second gate sidewalls upon the first and the second gate;

(h) utilizing a photolithography and an etching technique to form a third photoresist mask over the other one of the p-type and the n-type MOS regions and executing a third ion implantation in order to form thereon heavy doped first source and first drain;

(i) removing the third photoresist mask;

(j) using a photolithography and an etching technique to form a fourth photoresist mask on one of the p-type and the n-type MOS regions and performing a fourth ion implantation in order to form thereon heavy doped second source and second drain; and (k) eliminating the fourth photoresist mask.

According to the above descriptions, the conventional method employed for manufacturing the CMOS device includes the beginning process of forming the gate, the LDD process executed for eliminating the hot electron effects, and the final process of forming the source and the drain, in which at least five photolithography and etching processes are required for accomplishing the work. However, for eliminating the hot electron effects in order to promote the performance of the CMOS device, the process for executing the LDD is therefore unavoidable. Hence, how to reduce the number of the steps in performing the method for manufacturing the CMOS device is therefore a real challenge to all relevant researchers.

Accordingly, the most important factor which affects the consumed time and cost during the period of manufacturing the CMOS device is the needed photolithography and the etching process. Hence, if the number of the processes of the photolithography and the etching technique can be reduced and the performance promotion of the CMOS device can still be obtained, then the time and the cost consumed in the manufacturing process are thus decreased. Therefore, achieving the above mentioned advantages explains why the present invention is thus invented.

SUMMARY OF THE INVENTION

The object of the present invention is to provide a process for manufacturing the CMOS device, which can not only save cost and time but also promote the performance of the fabricated CMOS device.

The present invention is a process used for fabricating a CMOS device having thereon an active area, a field oxide, a pad oxide and a silicon substrate, in which, the active area further includes a gate oxide, a gate conducting layer covered on the field oxide and the gate oxide, and the active area is used for forming thereon at least a p-type and an n-type MOS regions, the process for fabricating the CMOS device includes (a) forming a first photoresist over the gate conducting layer, (b) define a first gate upon one of the p-type and the n-type MOS regions, (c) executing a first ion implantation in order to form a first lightly doped drain (LDD) on the one of the p-type and the n-type MOS regions, (d) forming a first gate sidewall on the first gate, (e) executing a second ion implantation in order to form a first source and a first drain on the one of the p-type and the n-type MOS regions, (f) forming a second photoresist over the gate conducting layer, (g) eliminating a portion of the second photoresist and another portion of the gate conducting layer in order to define a second gate upon the other one of the p-type and the n-type MOS regions, (h) performing a third ion implantation in order to form a second lightly doped drain (LDD) on the other one of the p-type and the n-type MOS regions, (i) selectively forming a specific oxide on the other one of the p-type and the n-type MOS regions, which is not masked by the second gate, (j) removing a portion of the specific oxide in order to form a second gate sidewall on the second gate, (k) executing a fourth ion implantation in order to form a second source and a second drain on the other one of the p-type and the n-type MOS regions, and (l) eliminating a remaining portion of the second photoresist.

In accordance with an aspect of the present invention, the gate conducting layer in step (a) is a polysilicon.

In accordance with another aspect of the present invention, the gate conducting layer in step (a) is a polycide made of a polysilicon and a silicide.

In accordance with another aspect of the present invention, the polycide is $WSi_x$.

In accordance with another aspect of the present invention, before step (b) the process further includes a step of removing a portion of the first photoresist and a portion of the gate conducting layer.

In accordance with another aspect of the present invention, an anisotropic dry etching is used for removing the portion of the first photoresist and the portion of the gate conducting layer.

In accordance with another aspect of the present invention, an ion density used in executing the first ion implantation in step (c) is $10^{13}$ ions/cm$^2$.

In accordance with another aspect of the present invention, step (d) further includes following steps, (d1) removing a remaining portion of the first photoresist, (d2) forming a sidewall oxide over the one of the p-type and the n-type MOS regions, (d3) executing a drive-in and an annealing process in order to heat and diffuse the first lightly doped drain (LDD) and (d4) eliminating a portion of the sidewall oxide in order to form the first gate sidewall on the first gate.

In accordance with another aspect of the present invention, the sidewall oxide in step (d2) is $SiO_2$.

In accordance with another aspect of the present invention, the sidewall oxide in step (d2) is $Si_3N_4$.

In accordance with another aspect of the present invention, the sidewall oxide in step (d2) is formed by a chemical vapor deposition (CVD).

In accordance with another aspect of the present invention, the drive-in and the annealing processes in step (d3) result a heat diffusion process having an operation temperature of 900°~1000° C.

In accordance with another aspect of the present invention, the portion of the sidewall oxide in step (d4) is removed by a dry etching.

In accordance with another aspect of the present invention, an ion density used in executing the second ion implantation in step (e) is $10^{15}$ ions/cm$^2$.

In accordance with another aspect of the present invention, the portion of the second photoresist and another portion of the gate conducting layer in step (g) is removed by an anisotropic dry etching.

In accordance with another aspect of the present invention, an ion density used for executing the third ion implantation in step (h) is $10^{13}$ ions/cm$^2$.

In accordance with another aspect of the present invention, before step (i) the process further includes a step of (i1) executing a drive-in and an annealing process in order to heat and diffuse the second lightly doped drain (LDD).

In accordance with another aspect of the present invention, the drive-in and the annealing process in step (i1) is a heat diffusion process having an operation temperature of 900°~1000° C.

In accordance with another aspect of the present invention, the specific oxide selectively formed by utilizing a liquid phase deposition (LPD) in step (i) is $SiO_2$ and has thereof a thickness of 500~2500 Å.

In accordance with another aspect of the present invention, an operation temperature for executing the liquid phase deposition (LPD) in step (i) is below 40° C.

In accordance with another aspect of the present invention, a $H_2SiF_6$ solution is used in step (i) for performing the liquid phase deposition (LPD).

In accordance with another aspect of the present invention, the portion of the specific oxide in step (j) is removed by an anisotropic dry etching.

In accordance with another aspect of the present invention, an ion density used for executing the fourth ion implantation in step (k) is $10^{15}$ ions/cm$^2$.

In accordance with another aspect of the present invention, before step (a) the process further includes following steps, (a1) defining the active area having thereon a dielectric region, (a2) executing an ion implantation for pre-depositedly forming a well and a channel stop on one of the p-type and the n-type MOS regions concurrently causing to the one of the p-type and the n-type MOS regions a punchthrough effect, (a3) performing another ion implantation for pre-depositedly forming another well and another channel stop on the other one of the p-type and the n-type MOS regions and concurrently causing a punchthrough effect on the other one of the p-type and the n-type MOS regions, (a4) forming the field oxide on the pad oxide excluding the active area to function as an isolation and executing an ion drive-in diffusion process to diffuse sequentially the well and the other well in order to respectively form the p-type and the n-type MOS regions, (a5) forming a sacrificial oxide over the field oxide and the dielectric region on the active area, (a6) adjusting threshold voltages of the p-type and the n-type MOS regions, (a7) removing the sacrificial oxide, the dielectric region on the active area and a portion of the pad oxide positioned under the dielectric region, (a8) growing the gate oxide on the active area and (a9) forming the gate conducting layer over the field oxide and the gate oxide.

In accordance with another aspect of the present invention, step (a1) further includes following steps, (a11) forming the pad oxide on the silicon substrate, (a12) forming a dielectric layer on the pad oxide and (a13) removing a portion of the dielectric layer in order to form said dielectric region for defining the active area.

In accordance with another aspect of the present invention, step (a2) further includes following steps, (a21) forming a first photoresist mask on the other one of the p-type and the n-type MOS regions, (a22) executing a fifth ion implantation in order to pre-depositedly form the well on the silicon substrate under one of the p-type and the n-type MOS regions, which is not masked by the first photoresist mask, (a23) performing a sixth ion implantation to form the channel stop on one of the p-type and the n-type MOS regions and (a24) executing a seventh ion implantation in order to accomplish said ion implantation causing to one of the p-type and the n-type MOS regions the punchthrough effect.

In accordance with another aspect of the present invention, step (a3) further includes following steps, (a31) forming a second photoresist mask on one of the p-type and the n-type MOS regions, (a32) executing an eighth ion implantation in order to pre-depositedly form the another well on the silicon substrate under the other one of the p-type and the n-type MOS regions, which is not masked by the second photoresist mask, (a33) performing a ninth ion implantation to form another channel stop on the other one of the p-type and the n-type MOS regions and (a34) executing a tenth ion implantation in order to accomplish the ion implantation causing to the other one of the p-type and the n-type MOS regions the punchthrough effect.

In accordance with another aspect of the present invention, step (a4) further includes following steps, (a41) removing the second photoresist mask and (a42) using a portion of the remaining portion of the dielectric layer as a mask in order to form the field oxide on the pad oxide excluding the active area as an isolation and to form an n-type and a p-type wells by driven-in diffusion ions pre-deposited in the well and the another well on the silicon substrate in order to respectively form the p-type and the n-type MOS regions.

In accordance with another aspect of the present invention, step (a6) further includes following steps, (a61) forming a third photoresist mask over one of the p-type and the n-type MOS regions, (a62) performing an eleventh ion implantation in order to regulate the threshold voltage of the other one of the p-type and the n-type MOS regions, (a63) removing the third photoresist mask, (a64) forming a fourth photoresist mask over the other one of the p-type and the n-type MOS regions, (a65) executing a twelfth ion implantation in order to regulate the threshold voltage of the one of the p-type and the n-type MOS regions and (a66) eliminating the fourth photoresist mask.

In accordance with another aspect of the present invention, the CMOS device is an N-channel well CMOS device.

In accordance with another aspect of the present invention, the CMOS device is a P-channel well CMOS device.

The present invention may be best understood through the following description with reference to the accompanying drawings, in which:

DETAILED DESCRIPTION OF THE PREFERRED EMBODIMENT

Figure 1A:
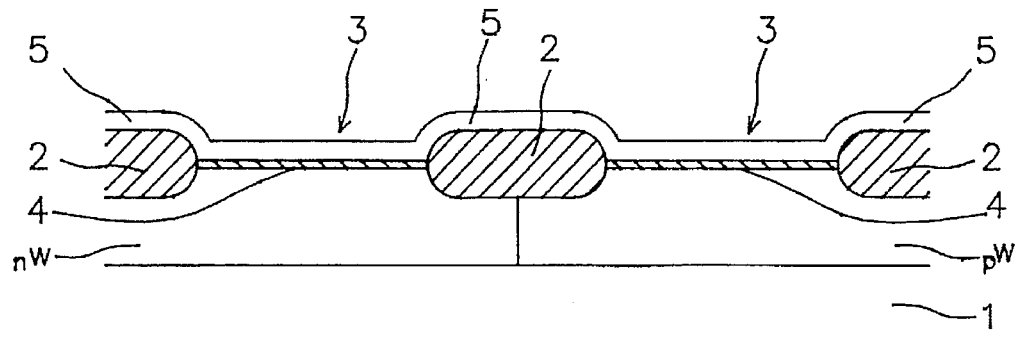
FIGS. 1(a)~1(g) are the schematic plots showing the preferred embodiment of a process for fabricating the CMOS device according to the present invention.

In the aforementioned conventional process for manufacturing the CMOS device, a great deal of the photolithography and the etching processes have to be introduced. However, for overcoming this defect, a Liquid Phase Deposition (LPD) is thus disclosed in the present invention in order to significantly reduce the processes utilized in the conventional method for manufacturing the CMOS device, and therefore to save time and cost required by the conventional process. Moreover, a CMOS device having the sound quality can also be accordingly obtained.

According to the present invention, the characteristic of the LPD is that there is different depositing selectivities for different kinds of materials. In general, the deposition can take place on the $SiO_2$ but it will not occur on the photoresist. Additionally, the deposition can be utilized as an isolation layer required by the integrated circuit device.

It can be verified that the present invention is practical by implementing the steps of the LPD mentioned hereinafter by one of ordinary skill in the art.

In performing the LPD, a boat containing therein a chip is put into a reacting container containing therein a reacting liquid made of a saturated $H_2SiF_6$ solution, and which is kept in its saturation state by continually adding $H_3BO_4$. In addition, the reacting container is further put in a water bath in order that a heater is employed to heat the reacting container for performing a liquid phase deposition (LPD) reaction.

FIGS. 1(a)~1(g) depict the implementing flow diagrams of a preferred embodiment process according to the present invention. In which, the employed CMOS device includes therein an active area 3, a field oxide 2 and a silicon substrate 1. The active area 3 further includes a gate oxide 4. The active area 31 is utilized to form a p-type and a n-type MOS regions, wherein the p-type and the n-type MOS regions have respectively therein an n well and a p well.

Figure 1B:
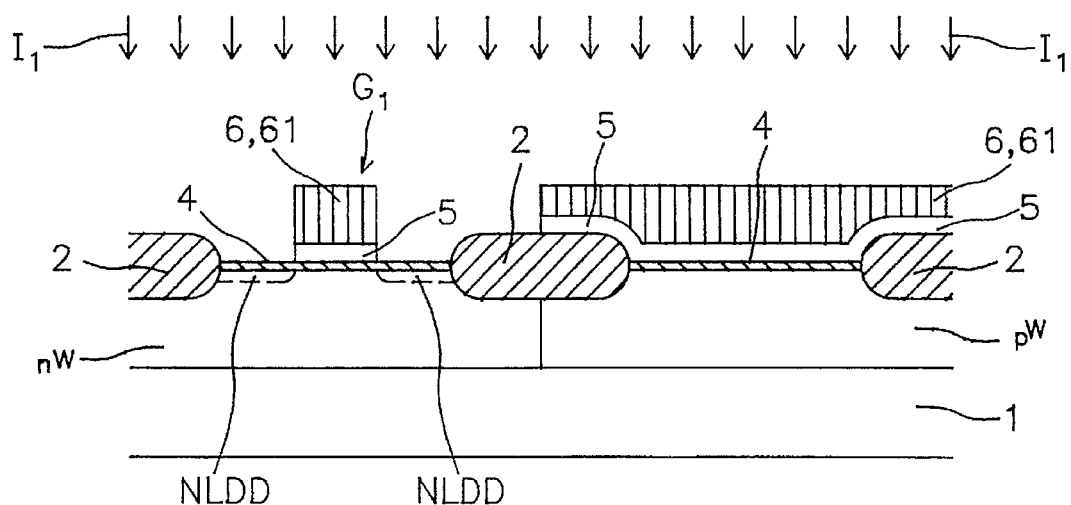
Figure 1C:
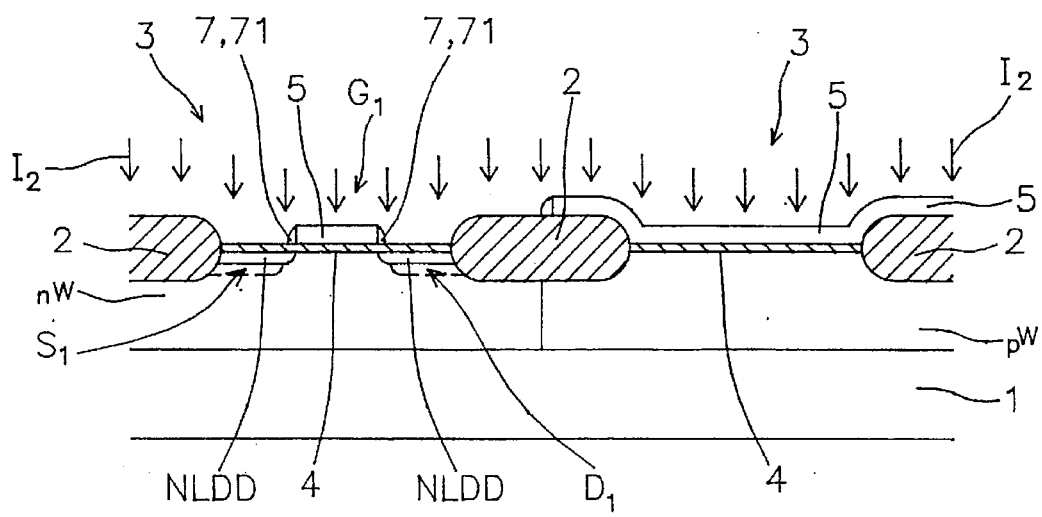
Figure 1D:
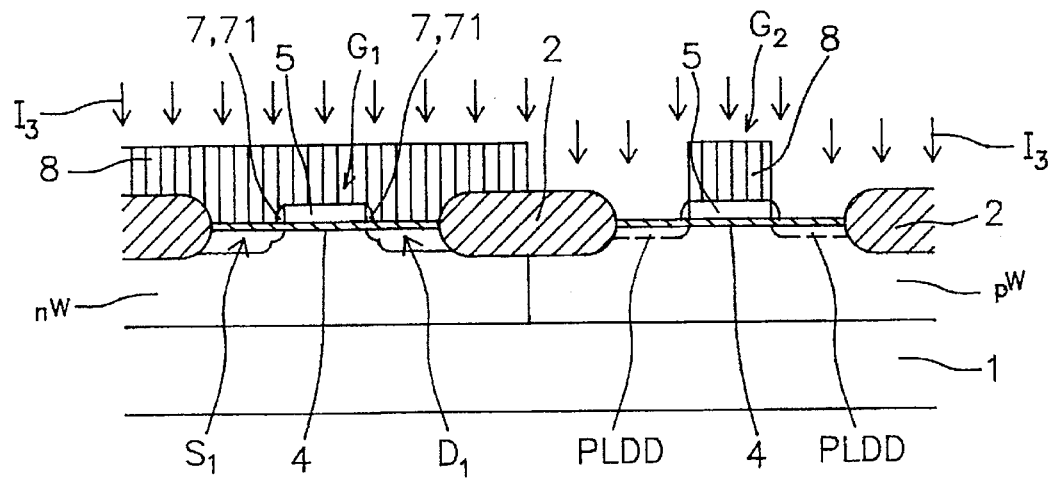
Figure 1E:
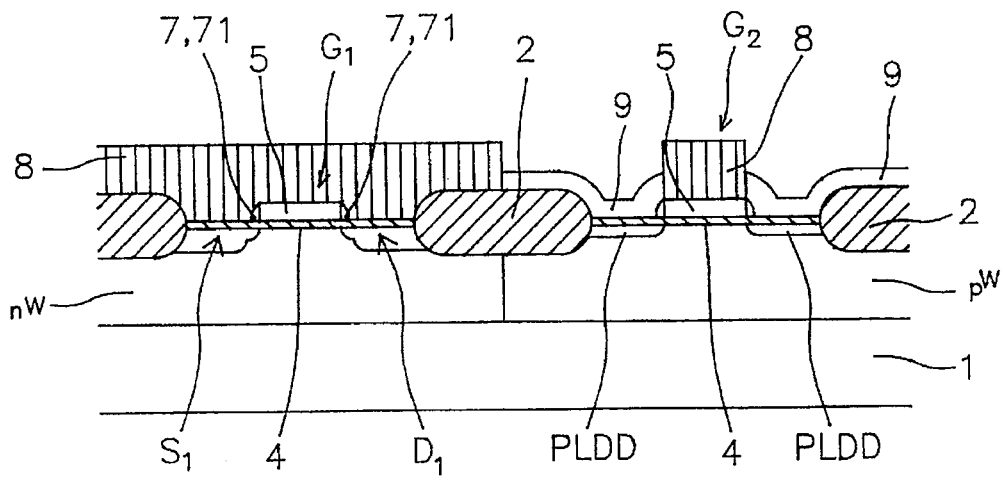
Figure 1F:
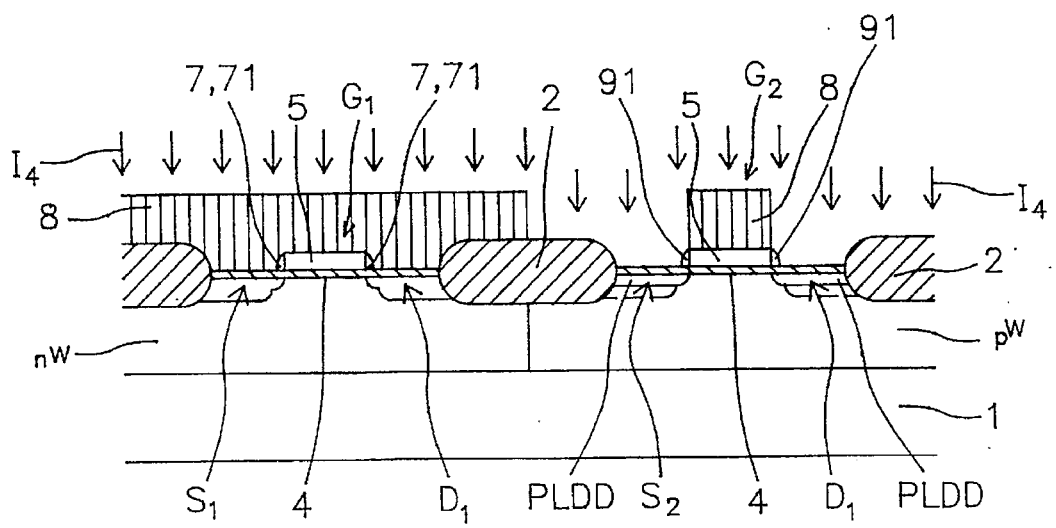
Figure 1G:
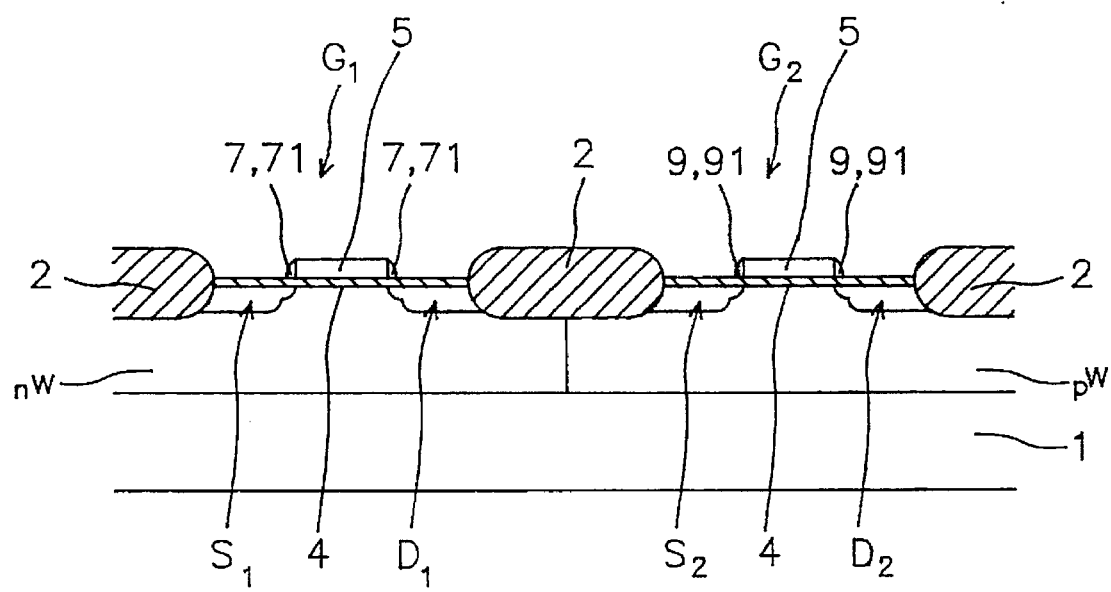

A preferred embodiment of the present invention containing all the processes of forming the gate, and completing the source and the drain is described as follows:

FIG. 1(a) portrays that:

Form a gate conducting layer 5 over the field oxide 2 and the gate oxide 4. A preferred gate conducting layer 5 is a polysilicon layer or a polycide made of a polysilicon and a silicide which can be $WSi_x$;

FIG. 1(b) contains the following steps:

Forming a first photoresist 6 upon the gate conducting layer 5;

Employing an anisotropic dry etching to remove a portion of the first photoresist 6 and a portion of the gate conducting layer 5 in order to define a first gate G1 on the p-type MOS region; and Using a dosage having an ion density of $10^{13}$ ions/cm$^2$ to execute a first ion implantation I1 in order to form a first lightly doped drain (LDD) NLDD on the p-type MOS region;

FIG. 1(c) includes the following steps:

Eliminating a remaining portion of the first photoresist 61;

Using the chemical vapor deposition (CVD) to form sidewall oxides 7 over the p-type MOS region, wherein the sidewall oxide 7 is a $SiO_2$ layer or a $Si_3N_4$ layer;

Executing a heat diffusion process having an operation temperature of 900°~1000° C., which includes a drive-in and an annealing process, in order to diffuse a first lightly doped drain (LDD);

Employing a dry etching to remove portions of the sidewall oxides 7 in order to form first gate sidewall 71 on the first gate G1; and Using a dosage having an ion density of $10^{15}$ ions/cm$^2$ to execute a second ion implantation I2 in order to form heavily dopedly a first source S1 and a first drain D1 on the p-type MOS region;

FIG. 1(d) contains the following steps:

Forming a second photoresist 8 over the gate conducting layer 5;

Using an anisotropic dry etching to remove a portion of the second photoresist 8 and another portion of the gate conducting layer 5 in order to define a second gate G2 over the n-type MOS region;

Employing a dosage having an ion density of $10^{13}$ ions/$cm^2$ to perform a third ion implantation I3 in order to form a second lightly doped drain (LDD) PLDD;

FIG. 1(e) describes that:

Performing a heat diffusion process having an operation temperature of 900°~1000° C., which includes a drive-in and an annealing process procedure in order to diffuse a second lightly doped drain (LDD); and Utilizing a Liquid Phase Deposition (LPD) below an operation temperature of 40° C. by using a $H_2SiF_6$ solution for selectively forming a $SiO_2$ layer 9 with a thickness of 500~2500 Å over the n-type MOS region not being covered by the second gate G2;

FIG. 1(f) portrays that:

Using an anisotropic dry etching to eliminate a portion of the $SiO_2$ layer 9 in order to form second sidewalls 91 on the second gate G2; and Employing a dosage having an ion density of $10^{15}$ ions/$cm^2$ to execute a fourth ion implantation I4 in order to form heavily dopedly a second source S2 and a second drain D2 over the n-type MOS region; and FIG. 1(g) describes that:

Removing the residual portion of the second photoresist 8.

In addition to the abovementioned processes, before the processes described in FIG. 1(a), the present process further includes the following steps. However, these steps are not confined to the following descriptions but can be altered by one of ordinary skill in the art at his own convenience. The steps include:

Defining the active area 3;

Executing an ion implantation in order to pre-depositedly form a well and channel stop in and cause a punch-through effect to the p-type MOS region;

Performing another ion implantation in order to pre-depositedly form a well and channel stop in and cause a punchthrough effect to the n-type MOS region;

Forming the field oxide 2 over an exposed pad oxide excluding the active area 3 in order to function as an isolation layer and executing a drive-in process for diffusing the n-type well and the p-type well in order to respectively form the p-type and the n-type MOS regions;

Forming a sacrificial oxide over the field oxide 2 and the dielectric layer on the active area 3;

Adjusting the threshold voltages of the p-type and the n-type MOS regions;

Eliminating the sacrificial oxide, the dielectric layer on the active area 3 and the pad oxide under dielectric layer; and Growing the gate oxide 4 on the active area 3.

The process disclosed in the present invention is not only to be utilized for manufacturing the CMOS device having twin tubs, but it is also employed to fabricate the CMOS device including therein a p well or an n well.

In sum, in accordance with the present invention, the number of the needed photolithography and the etching processes is reduced to merely two. In addition, the LDD can still be performed in the present invention to promote the performance of the CMOS device. Accordingly, it is clear that, the present invention can not only save the time and cost required for manufacturing the CMOS device but also can produce the CMOS device having a better quality. Consequently, the present invention is a practical and feasible application.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for fabricating a CMOS having thereon an active area, a field oxide, a pad oxide and a silicon substrate, in which, said active area further includes a gate oxide, a gate conducting layer covered on said field oxide and said gate oxide, and said active area is used for forming thereon at least a p-type and an n-type MOS regions, said process for fabricating said CMOS device comprising:

(a) forming a first photoresist over said gate conducting layer;

(b) form a first gate upon one of said p-type and said n-type MOS regions;

(c) executing a first ion implantation in order to form a first lightly doped drain (LDD) on said one of said p-type and said n-type MOS regions;

(d) forming a first gate sidewall on said first gate;

(e) executing a second ion implantation in order to form a first source and a first drain on said one of said p-type and said n-type MOS regions;

(f) forming a second photoresist over said gate conducting layer;

(g) removing a portion of said second photoresist and another portion of said gate conducting layer in order to form a second gate upon the other one of said p-type and said n-type MOS regions;

(h) performing a third ion implantation in order to form a second lightly doped drain (LDD) on said the other one of said p-type and said n-type MOS regions;

(i) selectively forming a specific oxide on said the other one of said p-type and said n-type MOS regions, which is not masked by said second gate;

(j) removing a portion of said specific oxide in order to form a second gate sidewall on said second gate;

(k) executing a fourth ion implantation in order to form a second source and a second drain on said the other one of said p-type and said n-type MOS regions; and (l) removing a remaining portion of said second photoresist.

2. A process for fabricating a CMOS device as claimed in claim 1, wherein said gate conducting layer in said step (a) is a polysilicon.

3. A process for fabricating a CMOS device as claimed in claim 1, wherein said gate conducting layer in step (a) is a polycide made of a polysilicon and a silicide.

4. A process for fabricating a CMOS device as claimed in claim 3, wherein said polycide is $WSi_x$.

5. A process for fabricating a CMOS device as claimed in claim 1, wherein before said step (b) said process further includes a step of removing a portion of said first photoresist and a portion of said gate conducting layer.

6. A process for fabricating a CMOS device as claimed in claim 5, wherein an anisotropic dry etching is used for removing said portion of said first photoresist and said portion of said gate conducting layer.

7. A process for fabricating a CMOS device as claimed in claim 1, wherein an ion density used in executing said first ion implantation in said step (c) is $10^{13}$ ions/cm$^2$.

8. A process for fabricating a CMOS device as claimed in claim 1, wherein said step (d) further includes following steps:

(d1) removing a remaining portion of said first photoresist;

(d2) forming a sidewall oxide over said one of said p-type and said n-type MOS regions;

(d3) executing a drive-in and an annealing process in order to heat and diffuse said first lightly doped drain (LDD); and (d4) eliminating a portion of said sidewall oxide in order to form said first gate sidewall on said first gate.

9. A process for fabricating a CMOS device as claimed in claim 8, wherein said sidewall oxide in said step (d2) is $SiO_2$.

10. A process for fabricating a CMOS device as claimed in claim 9, wherein said sidewall oxide in said step (d2) is $Si_3N_4$.

11. A process for fabricating a CMOS device as claimed in claim 8, wherein said sidewall oxide in said step (d2) is formed by a chemical vapor deposition (CVD).

12. A process for fabricating a CMOS device as claimed in claim 8, wherein said drive-in and said annealing processes in said step (d3) result a heat diffusion process having an operation temperature of 900°~1000° C.

13. A process for fabricating a CMOS device as claimed in claim 8, wherein said portion of said sidewall oxide in step (d4) is removed by a dry etching.

14. A process for fabricating a CMOS device as claimed in claim 1, wherein an ion density used in executing said second ion implantation in said step (e) is $10^{15}$ ions/cm$^2$.

15. A process for fabricating a CMOS device as claimed in claim 1, wherein said portion of said second photoresist and said another portion of said gate conducting layer in step (g) is removed by an anisotropic dry etching.

16. A process for fabricating a CMOS device as claimed in claim 1, wherein an ion density used for executing said third ion implantation in said step (h) is $10^{13}$ ions/cm$^2$.

17. A process for fabricating a CMOS device as claimed in claim 1, wherein before said step (i) said process further includes a step of:

(i1) executing a drive-in and an annealing process in order to heat and diffuse said second lightly doped drain (LDD).

18. A process for fabricating a CMOS device as claimed in claim 17, wherein said drive-in and said annealing process in said step (i1) is a heat diffusion process having an operation temperature of 900°~1000° C.

19. A process for fabricating a CMOS device as claimed in claim 1, wherein said specific oxide selectively formed by utilizing a liquid phase deposition (LPD) in said step (i) is $SiO_2$ and has thereof a thickness of 500°~2500 Å.

20. A process for fabricating a CMOS device as claimed in claim 19, wherein an operation temperature for executing said liquid phase deposition (LPD) in said step (i) is below 40° C.

21. A process for fabricating a CMOS device as claimed in claim 19, wherein a $H_2SiF_6$ solution is used in said step (i) for performing said liquid phase deposition (LPD).

22. A process for fabricating a CMOS device as claimed in claim 1, wherein said portion of said specific oxide in said step (j) is removed by an anisotropic dry etching.

23. A process for fabricating a CMOS device as claimed in claim 1, wherein an ion density used for executing said fourth ion implantation in said step (k) is $10^{15}$ ions/cm$^2$.

24. A process for fabricating a CMOS device as claimed in claim 1, wherein before said step (a) said process further includes following steps:

(a1) defining said active area having thereon a dielectric region;

(a2) executing an ion implantation for forming a well and a channel stop on said one of said p-type and said n-type MOS regions and concurrently causing to said one of said p-type and said n-type MOS regions a punchthrough effect;

(a3) performing another ion implantation for pre-depositedly forming another well and another channel stop on said the other one of said p-type and said n-type MOS regions and concurrently causing a punchthrough effect on said the other one of said p-type and said n-type MOS regions;

(a4) forming said field oxide on said pad oxide excluding said active area to function as an isolation and executing an ion drive-in diffusion process to diffuse sequentially said well and said the other well in order to respectively form said p-type and said n-type MOS regions;

(a5) forming a sacrificial oxide over said field oxide and said dielectric region on said active area;

(a6) adjusting threshold voltages of said p-type and said n-type MOS regions;

(a7) removing said sacrificial oxide, said dielectric region on said active area and a portion of said pad oxide positioned under said dielectric region;

(a8) growing said gate oxide on said active area; and (a9) forming said gate conducting layer over said field oxide and said gate oxide.

25. A process for fabricating a CMOS device as claimed in claim 24, wherein said step (a1) further includes following steps:

(a11) forming said pad oxide on said silicon substrate;

(a12) forming a dielectric layer on said pad oxide; and (a13) removing a portion of said dielectric layer in order to form said dielectric region for defining said active area.

26. A process for fabricating a CMOS device as claimed in claim 24, wherein said step (a2) further includes following steps:

(a21) forming a first photoresist mask on said the other one of said p-type and said n-type MOS regions;

(a22) executing a fifth ion implantation in order to pre-depositedly form said well on said silicon substrate under said one of said p-type and said n-type MOS regions, which is not masked by said first photoresist mask;

(a23) performing a sixth ion implantation to form said channel stop on said one of said p-type and said n-type MOS regions; and (a24) executing a seventh ion implantation in order to accomplish said ion implantation causing to said one of said p-type and said n-type MOS regions said punchthrough effect.

27. A process for fabricating a CMOS device as claimed in claim 24, wherein said step (a3) further includes following steps:

(a31) forming a second photoresist mask on said one of said p-type and said n-type MOS regions;

(a32) executing an eighth ion implantation in order to pre-depositedly form said another well on said silicon substrate under said the other one of said p-type and said n-type MOS regions, which is not masked by said second photoresist mask;

(a33) performing a ninth ion implantation to form said another channel stop on said the other one of said p-type and said n-type MOS regions; and (a34) executing a tenth ion implantation in order to accomplish said ion implantation causing to said the other one of said p-type and said n-type MOS regions said punchthrough effect.

28. A process for fabricating a CMOS device as claimed in claim 27, wherein said step (a4) further includes following steps:

(a41) removing said second photoresist mask; and (a42) using said portion of said remaining portion of said dielectric layer as a mask in order to form said field oxide on said pad oxide excluding said active area as an isolation and to form an n-type and a p-type wells by driven-in diffusion ions pre-deposited in said well and said another well on said silicon substrate in order to respectively form said p-type and said n-type MOS regions.

29. A process for fabricating a CMOS device as claimed in claim 24, wherein said step (a6) further includes following steps:

(a61) forming a third photoresist mask over said one of said p-type and said n-type MOS regions;

(a62) performing an eleventh ion implantation in order to regulate said threshold voltage of said the other one of said p-type and said n-type MOS regions;

(a63) removing said third photoresist mask;

(a64) forming a fourth photoresist mask over said the other one of said p-type and said n-type MOS regions;

(a65) executing a twelfth ion implantation in order to regulate said threshold voltage of said one of said p-type and said n-type MOS regions; and (a66) eliminating said fourth photoresist mask.

30. A process for fabricating a CMOS device as claimed in claim 1, wherein said CMOS device is an n channel MOS device.

31. A process for fabricating a CMOS device as claimed in claim 1, wherein said CMOS device is a p channel MOS device.

* * * * *